(12) United States Patent
Wakamatsu et al.

(10) Patent No.: US 8,883,023 B2
(45) Date of Patent: Nov. 11, 2014

(54) METHOD FOR FORMING PATTERN

(71) Applicant: JSR Corporation, Tokyo (JP)

(72) Inventors: Goji Wakamatsu, Tokyo (JP); Hayato Namai, Tokyo (JP); Syun Aoki, Tokyo (JP)

(73) Assignee: JSR Corporation, Tokyo (JP)

( * ) Notice: Subject to any disclaimer, the term of this patent is extended or adjusted under 35 U.S.C. 154(b) by 8 days.

(21) Appl. No.: 13/630,207

(22) Filed: Sep. 28, 2012

(65) Prior Publication Data

US 2013/0098870 A1     Apr. 25, 2013

Related U.S. Application Data

(60) Provisional application No. 61/540,664, filed on Sep. 29, 2011, provisional application No. 61/614,528, filed on Mar. 23, 2012.

(51) Int. Cl.
| | |
|---|---|
| *C03C 15/00* | (2006.01) |
| *G03F 7/00* | (2006.01) |
| *B44C 1/22* | (2006.01) |
| *H01L 21/00* | (2006.01) |
| *G03F 7/09* | (2006.01) |

(52) U.S. Cl.
CPC . *B44C 1/227* (2013.01); *G03F 7/00* (2013.01); *G03F 7/091* (2013.01); *G03F 7/094* (2013.01); *H01L 21/00* (2013.01); *Y10S 430/118* (2013.01)
USPC .............. 216/49; 216/37; 216/67; 430/270.1; 430/917

(58) Field of Classification Search
USPC .............. 216/37, 49, 67; 430/270.1, 273.195, 430/917
See application file for complete search history.

(56) References Cited

U.S. PATENT DOCUMENTS

| | | | |
|---|---|---|---|
| 7,745,104 B2 * | 6/2010 | Hatakeyama et al. | ........ 430/323 |
| 2010/0028802 A1 * | 2/2010 | Konno et al. | ............. 430/270.1 |
| 2010/0047709 A1 | 2/2010 | Echigo et al. | |
| 2013/0157195 A1 * | 6/2013 | Green et al. | ............... 430/281.1 |

FOREIGN PATENT DOCUMENTS

| | | |
|---|---|---|
| JP | 2000-143937 | 5/2000 |
| JP | 2001-040293 | 2/2001 |
| JP | 2004-168748 | 6/2004 |
| JP | 2004-177668 | 6/2004 |

\* cited by examiner

*Primary Examiner* — Duy Deo
*Assistant Examiner* — Maki Angadi
(74) *Attorney, Agent, or Firm* — Oblon, Spivak, McClelland, Maier & Neustadt, L.L.P.

(57) ABSTRACT

A method for forming a pattern includes providing a composition to form a resist underlayer film on a surface of a substrate to be processed. The composition contains a calixarene based compound having a group represented by a following formula (i) bound to at least a part of an aromatic ring or at least a part of a heteroaromatic ring of the calixarene based compound. The resist underlayer film on the surface of the substrate is treated with heat or an acid. A resist pattern is formed on a surface of the resist underlayer film. The resist underlayer film and the substrate are etched using the resist pattern as a mask to form the pattern on the substrate. The dry-etched resist underlayer film is removed from the substrate with a basic solution.

$$—O—R^1 \qquad (i)$$

3 Claims, No Drawings

METHOD FOR FORMING PATTERN

CROSS-REFERENCE TO RELATED APPLICATIONS

The present application claims priority under 35 U.S.C. §119 to the U.S. Provisional Patent Application Ser. No. 61/540,664 filed Sep. 29, 2011 and to the U.S. Provisional Patent Application Ser. No. 61/614,528 filed Mar. 23, 2012. The contents of these applications are incorporated herein by reference in their entirety.

BACKGROUND OF THE INVENTION

1. Field of the Invention

The present invention relates to a method for forming a pattern.

2. Discussion of the Background

In manufacturing integrated circuit elements and the like, a method for forming a pattern utilizing a multilayer resist process has been in widespread use to meet miniaturization of processing size. In the multilayer resist process, a resist underlayer film is generally formed by coating on the upper face side of the substrate to be processed with a composition for forming a resist underlayer film, and a resist coating film is formed by coating on the upper face side of the resist underlayer film with a resist composition. Then, a mask pattern is transferred to the resist coating film through the irradiation of radioactive ray by means of a stepping projection aligner (stepper) or the like, and subsequent development with a proper developer solution gives a resist pattern. Subsequently, the resist pattern is transferred to the resist underlayer film by etching. Finally, the resist underlayer film pattern is transferred to the substrate to be processed by etching, whereby the substrate with a desired pattern can be obtained. Furthermore, a multilayer resist process involving three or more layers may be employed, in which an intermediate layer is further provided on the upper face side of the resist underlayer film. Additionally, in the formation of the resist pattern other methods that exclude the use of the resist composition, for example a nanoinprint method, are also used.

Generally, materials having a high carbon content are used for the resist underlayer film placed directly on the substrate to be processed. Such a high carbon content leads to the increase in etching selectivity at the time of the processing of the substrate to be processed, which enables more precise pattern transfer. Thermosetting phenol novolak resins are particularly well-known as materials for the underlayer film. Additionally, it is known that a composition containing an acenaphthylene based polymer exhibits favorable characteristics as the underlayer film (see Japanese Unexamined Patent Application, Publication Nos. 2000-143937 and 2001-40293).

Since the above-described resist underlayer film becomes useless after the pattern formation by the etching, it is removed by ashing or the like. The ashing is typically a process in which oxygen plasma is generated and organic components in the resist underlayer film are burned out by oxygen radicals in the plasma. A technique for peeling the resist underlayer film with a solution has been proposed (see Japanese Unexamined Patent Application, Publication No. 2004-177668).

SUMMARY OF THE INVENTION

According to one aspect of the present invention, a method for forming a pattern includes providing a composition to form a resist underlayer film on an upper face side of a substrate to be processed, the composition containing a calixarene based compound having a group represented by a following formula (i) bound to at least a part of an aromatic ring or at least a part of a heteroaromatic ring of the calixarene based compound.

$R^1$ represents a group that generates an acidic functional group by an action of heat or an acid. A resist pattern is formed on an upper face side of the resist underlayer film. The resist underlayer film and the substrate are etched using the resist pattern as a mask to form the pattern on the substrate. The etched resist underlayer film is removed from the substrate with a basic solution. The resist underlayer film is treated with heat or an acid prior to removing the etched resist underlayer film

DESCRIPTION OF THE EMBODIMENTS

An aspect of the embodiments of the present invention provides a method for forming a pattern, including the steps in the following order of:

(a) forming a resist underlayer film on the upper face side of a substrate to be processed using a composition for forming a resist underlayer film containing a calixarene based compound;

(b) forming a resist pattern on the upper face side of the resist underlayer film;

(c) forming a pattern on the substrate to be processed by etching of any one selected from the group consisting of the resist underlayer film, the substrate to be processed and a combination thereof with the aid of the resist pattern as a mask; and (d) removing the resist underlayer film on the processed substrate with a basic solution, in which the method further includes prior to the step (d), a step of treating the resist underlayer film with heat or an acid, in which a group represented by the following formula (i) (hereinafter, may be also referred to as "specified group (i)") is bound to at least a part of an aromatic ring or heteroaromatic ring of the calixarene based compound.

In the formula (i), $R^1$ represents a group that generates an acidic functional group by an action of heat or an acid.

The method for forming a pattern of the embodiment of the present invention includes the above-described steps, and uses a composition containing a calixarene based compound in which the specified group (i) is bound to at least a part of the aromatic ring or heteroaromatic ring (hereinafter, may be also referred to as "specified calixarene based compound") as the composition for forming a resist underlayer film. The specified group (i) contains a group, $R^1$ that generates an acidic functional group by an action of heat or an acid. The resist underlayer film formed using the composition containing the specified calixarene based compound has superior heat resistance, and can be heated to comparatively high temperatures, and thereby $R^1$ is allowed to generate the acidic functional group in a step of treating the resist underlayer film with heat or an acid prior to the step (d), which leads to easy dissolution of the resist underlayer film in basic solutions. As a result, the resist underlayer film after an etching step can be removed with treatment with a basic solution without asking. Therefore, the method for forming a pattern of the embodiment of the present invention enables easy removal of the resist underlayer film after the etching step, with reducing the influence on a substrate such as low dielectric materials.

Preferably, the method for forming a pattern of the embodiment of the present invention includes between the step (a) and the step (b), a step of (a') forming an intermediate layer on the upper face side of the resist underlayer film, and the intermediate layer is further etched in the step (c).

According to the method for forming a pattern of the embodiment of the present invention, by forming the intermediate layer between the resist underlayer film and the resist film, resist processes involving more layers can be performed, and as a result, a more miniaturized pattern with more favorable shape can be obtained.

The term "calixarene based compound" used herein refers to a cyclic oligomer in which a plurality of aromatic rings bearing a hydroxy group or heteroaromatic rings bearing a hydroxy group are coupled in a cyclic manner via a hydrocarbon group, in which apart or all of the hydrogen atoms present in the hydroxy group (s), the aromatic ring(s), the heteroaromatic ring(s) and linear hydrocarbon group(s) may be substituted.

As explained above, according to the method for forming a pattern of the embodiment of the present invention, the resist underlayer film after the etching step can be easily removed, with reducing the influence on the substrate. Therefore, the method for forming a pattern of the embodiment of the present invention can be suitably used for low dielectric materials used in semiconductor substrates, and can produce pattern-formed substrates of high-quality.

Hereinafter, an embodiment of the method for forming a pattern of the embodiment of the present invention will be explained in detail.

<Method of Pattern Formation>

The method for forming a pattern of the embodiment of the present invention includes the steps in the following order of:

(a) forming a resist underlayer film on the upper face side of a substrate to be processed using a composition for forming a resist underlayer film containing a specified calixarene based compound;

(b) forming a resist pattern on the upper face side of the resist underlayer film;

(c) forming a pattern on the substrate to be processed by etching of any one selected from the group consisting of the resist underlayer film, the substrate to be processed and a combination thereof with the aid of the resist pattern as a mask; and (d) removing the resist underlayer film on the processed substrate with a basic solution in this order, in which the method further includes prior to the step (d), a step of treating the resist underlayer film with heat or an acid.

Moreover, the method for forming a pattern of the embodiment of the present invention may include between the step (a) and the step (b), (a') forming an intermediate layer on the upper face side of the resist underlayer film, and in the step (c), the intermediate layer may also be etched. Hereinafter, each of the steps described above will be explained in more detail.

<Step (a)>

In the step (a), a resist underlayer film is formed on the upper face side of a substrate to be processed, using a composition for forming a resist underlayer film containing a specified calixarene based compound. The composition for forming a resist underlayer film will be described hereinbelow.

For example, silicon wafers, aluminum-coated wafers and the like can be used as the substrate to be processed.

In addition, the method of applying the composition for forming a resist underlayer film to the substrate to be processed is not particularly limited, and may be carried out by any suitable method, for example, spin-coating, cast coating, roll coating and the like.

Moreover, heating is typically carried out after applying the composition for forming a resist underlayer film to the substrate to be processed, for the purpose of drying the coated film, and the like.

The film thickness of the resist underlayer film formed in the step (a) is typically 10 nm to 5 μm, and preferably, 30 nm to 0.5 μm.

<Step (a')>

The intermediate layer formed in this step refers to a layer for reinforcing the functions possessed by the resist underlayer film and/or the resist coating film or for providing functions with the resist underlayer film and/or the resist film which are not possessed by these films, in forming a resist pattern. In the case in which an antireflective film is, for instance, formed as the intermediate layer, the intermediate film can reinforce the antireflecting function of the resist underlayer film.

The intermediate layer may be formed from an organic compound or an inorganic oxide. As the organic compound, for example, materials commercially available from Brewer Science, Inc. under the trade name "DUV-42", "DUV-44", "ARC-28", "ARC-29" and the like, and materials commercially available from Rohm & Haas Company under the trade name "AR-3", "AR-19" and the like may be used. Moreover, as the inorganic oxide, for example, materials commercially available from JSR Corporation under the trade name "NFC SOG" series, and polysiloxanes, titanium oxide, oxidized alumina, and tungsten oxide which are formed by a CVD process may be used.

The method of forming the intermediate layer is not particularly limited, and for example, a coating method, a CVD method or the like may be employed. Of these, the coating method is preferred. When the coating method is employed, the intermediate layer may be consecutively formed after forming the resist underlayer film.

Furthermore, the film thickness of the intermediate layer is not particularly limited, and appropriately selected in accordance with the function required for the intermediate layer, but is preferably 10 nm to 3 μm, and more preferably 20 nm to 300 nm.

<Step (b)>

In the step (b), the resist pattern is formed on the upper face side of the resist underlayer film. This step is exemplified by a step of using photolithography, and the like. Hereinafter, detailed explanation will be given.

The step of using the photolithography includes, for example, the steps of:

(b-1) forming a resist coating film on the resist underlayer film using a resist composition;

(b-2) selectively irradiating the resist coating film with a radioactive ray to expose the resist coating film to radiation; and (b-3) developing the exposed resist coating film to form the resist pattern.

In the step (b-1), the resist composition is used to form the resist coating film on the resist underlayer film. Specifically, the resist coating film is formed by applying the resist composition so that the resultant resist coating film has the desired film thickness, and subsequently prebaking the resist composition to evaporate the solvent in the coated film.

The resist composition is exemplified by a positive type or negative type chemically amplified resist composition containing a photo acid generating agent, a positive type resist composition constituted with an alkali-soluble resin and a quinonediazide based photosensitizing agent, a negative type resist composed of an alkali-soluble resin and a crosslinking agent, and the like.

The resist composition typically has a solid content in the range of about 5 to 50% by mass, and is generally served to the formation of the resist coating film after being filtered, for example, through a filter with a pore size of 0.2 µm. Nonetheless, in this step, a commercially available resist composition may be directly used.

Coating method of the resist composition is not particularly limited, and the coating may be performed, for example, by a spin coating method and the like.

Additionally, the prebaking temperature is appropriately adjusted in accordance with the type of the resist composition used and the like, and is typically in the range of 30° C. to 200° C., and preferably 50° C. to 150° C.

In the step (b-2), a predetermined region of the resist coating film thus obtained is irradiated with a radioactive ray, to selectively expose the resist coating film to radiation.

The radioactive ray appropriately selected from visible light rays, ultraviolet rays, deep ultraviolet rays, X-ray, an electron beam, γ-ray, a molecular beam, an ion beam and the like in accordance with on the type of the photo acid generating agent used may be irradiated for the exposure. The radioactive ray is preferably far ultraviolet rays typified by KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), and extreme ultraviolet rays (wavelength: 13 nm, etc.) are preferred, and in particular, ArF excimer laser light is preferred.

In the step (b-3), the resist coating film after the exposure is developed with a developer solution to form the resist pattern.

The developer solution used in this step is appropriately selected in accordance with the type of the resist composition used. Specifically, the developer solution is exemplified by, for example, alkaline aqueous solutions such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, and the like. It is to be noted that if the step (a') is conducted and the intermediate layer is formed, the influence of these alkaline aqueous solutions on the resist underlayer film can be reduced.

To the alkaline aqueous solutions, a suitable amount of a water soluble organic solvent, for example, an alcohol such as methanol, ethanol and the like, or a surfactant can be added.

Moreover, an organic solvent-containing developer solution may be used as the developer solution. The organic solvent includes, for example, esters, ketones, ethers, alcohols, amides, hydrocarbons, and the like. Development with the organic solvent has a minor influence on the resist underlayer film.

Furthermore, after the development with the developer solution, washing and drying are conducted to form the predetermined resist pattern.

It is to be noted that in this step, in order to improve resolution, pattern profile, developability and the like, post-baking may be conducted after the exposure and before the development (i.e., after the step (b-2) and before the step (b-3)). The temperature for the post-baking is appropriately adjusted in accordance with the type of the resist composition used and the like, but is typically in the range of 50° C. to 200° C., and preferably 70° C. to 150°.

<Step (c)>

In the step (c), a pattern is formed on the substrate to be processed by etching of any one selected from the group consisting of the resist underlayer film, the substrate to be processed and a combination thereof with the aid of the resist pattern as a mask. It is to be noted that if the intermediate layer is formed, the intermediate layer is further etched. Either dry etching or wet etching may be adopted as the etching, and preferably dry etching is adopted.

The dry etching may be effected using any well-known dry etching apparatus. In addition, depending on the elemental composition of the object to be etched, oxygen atom-containing gases such as $O_2$, CO, and $CO_2$, inert gases such as He, $N_2$, and Ar, chlorine based gases such as $Cl_2$ and $BCl_3$, fluorine based gases such as $CHF_3$ and $CF_4$, other gases such as $H_2$ and $NH_3$ can be used as a source gas in the dry etching. It is to be noted that these gases may also be used in mixture.

<Step of Treatment of Resist Underlayer Film with Heat or Acid>

The method for forming a pattern of the embodiment of the present invention further includes prior to the step (d), a step of treating the resist underlayer film with heat or an acid, thereby dissociating a part or all of $R^1$ carried on the specified group (i) of the specified calixarene based compound and generating the acidic functional group. Thus, the dissociation of $R^1$ carried on the specified calixarene based compound and the generation of the acidic functional group lead to easy removal of the formed resist underlayer film with the basic solution.

A method of dissociating a part or all of $R^1$ is preferably to heat the resist underlayer film. The heating temperature used herein is preferably 100° C. to 330° C., more preferably 200° C. to 320° C., and more preferably 240° C. to 300° C. Additionally, the heating time used herein is 30 sec to 600 sec, and preferably 45 sec to 240 sec. Furthermore, the oxygen concentration during the heating is preferably no less than 5% by volume, and more preferably no less than 20% by volume.

It is to be noted that if a thermal acid generating agent and the like is contained in the composition for forming a resist underlayer film, the acid generated from the thermal acid generating agent and the like by heat may partially or completely dissociate $R^1$. As a result, it is possible to dissociate $R^1$ at lower temperatures.

The method of dissociating a part or all of $R^1$ also includes a method of treating the resist underlayer film with an acid, apart from the heating method described above. The method of treating the resist underlayer film with the acid includes a method of washing the resist underlayer film with the acid, a method of irradiating the resist underlayer film with light (when the composition for forming a resist underlayer film contains the photo acid generating agent, etc.), and the like.

The time point when the step of treating the resist underlayer film with the heat or an acid is performed is not particularly limited as long as the treatment step is performed prior to the step (d) in the method for forming a pattern of the embodiment of the present invention, and includes for example, at least any point of time of: between the step (a) and the step (b) (between the step (a) and the step (a') or between the step (a') and the step (b)); between the step (b) and the step (c); after the step (c); simultaneously with the step (a), the step (b) or the step (c); and a combination thereof, and the like. Of these, in light of ease of operation, carrying out the treatment simultaneously with the step (a), i.e., as the heating during the formation of the resist underlayer film, and the like, or after the step (c), i.e., on the resist underlayer film after the etching step is preferred.

<Step (d)>

In the step (d), the resist underlayer film on the processed substrate is removed with a basic solution.

The basic solution used in this step is not particularly limited as long as it is basic, and for example basic aqueous solutions such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetramethylammonium hydroxide (TMAH), tetraethylammonium hydroxide, pyrrole, piperidine, choline, 1,8-diazabicyclo[5.4.0]-7-undecene, 1,5-diazabicyclo[4.3.0]-5-nonene and the like may be used. Of these, TMAH aqueous solution is preferred. In addition, a suitable amount of a water soluble organic solvent, for example, an alcohol such as methanol, ethanol or the like, or a surfactant may be added to these basic aqueous solutions. Moreover, the basic solution may be a solution containing an organic solvent in addition to or instead of water as long as the solution is basic.

The pH of the basic solution is, for example, preferably no less than 7.5, and more preferably no less than 8. If the pH is below 7.5, the resist underlayer film may not be removed sufficiently.

The method of removing the resist underlayer film with the basic solution is not particularly limited, as long as the method allows the resist underlayer film and the basic solution to contact with each other for a certain period of time, and includes, for example, a method of immersing the processed, pattern-formed substrate in the basic solution, a method of spraying the basic solution, a method of coating the processed substrate with the basic solution, and the like. Further, the immersion time in the immersion method may be, for example, in the range of 0.2 min to 30 min. It is preferred to wash the processed substrate with water and dry it after the completion of the respective methods.

Since according to the method for forming a pattern of the embodiment of the present invention, the resist underlayer film is removed with the basic solution after the pattern is formed on the substrate to be processed by etching, as described above, the present method enables easy removal of the resist underlayer film with reducing the influence on the substrate. In particular, according to the method for forming a pattern of the embodiment of the present invention, even when low dielectric materials, which are susceptible to the influence of asking and the like, are used as the substrate, the resist underlayer film can be removed with reducing the influence on the substrate.

[Resist Underlayer Film Forming Composition]

The composition for forming a resist underlayer film used in the method for forming a pattern of the embodiment of the present invention includes (A) specified calixarene based compound (hereinafter, may be also referred to as "compound (A)"), and optionally solvent (B), other components and the like. Hereinafter, each component will be described in detail.

[Compound (A)]

The compound (A) is a calixarene based compound, in which the group represented by the above formula (i) is bound to at least a part of the aromatic ring or heteroaromatic ring.

In the above formula (i), $R^1$ is a group that generates an acidic functional group by an action of the heat or an acid.

The aromatic ring carried by the compound (A) includes, for example, a benzene ring, a naphthalene ring, and the like.

In addition, the heteroaromatic ring carried by the compound (A) includes, for example, a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring, a triazine ring, and the like. Of these, the aromatic ring is preferred, and a benzene ring is more preferred.

The hydrocarbon group that couples the aromatic ring or heteroaromatic ring of the compound (A) includes, for example, a linear hydrocarbon group having 1 to 8 carbon atoms. In particular, a saturated hydrocarbon group having 1 to 8 carbon atoms is preferred, and a saturated hydrocarbon group having 1 to 6 carbon atoms is more preferred.

The acidic functional group generated from $R^1$ by an action of the heat or an acid can include, for example, a phenolic hydroxyl group, a carboxy group, a sulfo group and the like, and the phenolic hydroxyl group or the carboxy group is preferred.

Moreover, the group represented by $R^1$ includes, for example, a group represented by $—CR^3R^4R^5$ (in which $R^3$ to $R^5$ are each independently an alkyl group having 1 to 4 carbon atoms or an alicyclic hydrocarbon group having 4 to 20 carbon atoms. Alternatively, $R^4$ and $R^5$ may be attached with each other to form, together with the carbon atom to which they are attached, a bivalent alicyclic hydrocarbon group having 4 to 20 carbon atoms.), t-(cyclo)alkyloxycarbonylmethyl group such as a t-butoxycarbonylmethyl group, a 2-alkyl-2-adamantyloxycarbonylmethylgroup and the like, a t-alkoxycarbonyl group such as a t-butoxycarbonyl group, an alkoxy substituted methyl group such as a methoxymethyl group, an ethoxymethyl group, and the like. Of these, the t-(cyclo)alkyloxycarbonylmethyl group, the t-butoxycarbonyl group, and the alkoxy substituted methyl group are preferred, the t-(cyclo)alkyloxycarbonylmethyl group is more preferred, and a 2-ethyl-2-adamantyloxycarbonylmethyl group, and a t-butoxycarbonylmethyl group are even more preferred.

The alkyl group having 1 to 4 carbon atoms represented by each $R^3$ to $R^5$ include, for example, a methyl group, an ethyl group, an n-propyl group, an i-propyl group, an n-butyl group, a 2-methylpropyl group, a 1-methylpropyl group, a t-butyl group, and the like. The alicyclic hydrocarbon group having 4 to 20 carbon atoms represented by each $R^3$ to $R^5$, and the bivalent alicyclic hydrocarbon group having 4 to 20 carbon atoms that may be formed by $R^4$ and $R^5$ attached with each other together with the carbon atom to which they are attached include, for example, a group having a bridged skeleton such as an adamantane skeleton, a norbornane skeleton, a tricyclodecane skeleton, a tetracyclododecane skeleton; a group having a monocyclic cycloalkane skeleton such as cyclobutane, cyclopentane, cyclohexane, cycloheptane, cyclooctane; and a group formed by substituting any of the above-listed groups with one or more linear, branched or cyclic alkyl group having 1 to 10 carbon atoms such as a methyl group, an ethyl group, an n-propyl group, an i-propyl group, an n-butyl group.

In addition to the hydrocarbon group that couples the rings of the specified calixarene based compound, for example, a group such as a halogen atom, a hydroxy group, or a monovalent organic group having 1 to 30 carbon atoms (hereinafter, may be also referred to as "group (a)") may be bound to the aromatic ring or heteroaromatic ring of the compound (A). Examples of the halogen atom include a fluorine atom, a chlorine atom, a bromine atom, an iodine atom, and the like. Furthermore, the monovalent organic group having 1 to 30 carbon atoms is exemplified by an alkyl group having 1 to 30 carbon atoms, an alkenyl group having 2 to 30 carbon atoms, an alkynyl group having 2 to 30 carbon atoms, a cycloalkyl group having 3 to 30 carbon atoms, a cycloalkenyl group having 3 to 30 carbon atoms, a cycloalkynyl group having 8 to 30 carbon atoms, an aryl group having 6 to 30 carbon atoms, an aralkyl group having 7 to 30 carbon atoms, a heterocyclic group having 3 to 30 carbon atoms, and the like. A part of or all hydrogen atoms of these alkyl group, alkenyl group, alkynyl group, cycloalkyl group, cycloalkenyl group, cycloalkynyl group, aryl group, aralkyl group and heterocyclic group may be substituted by a substituent. The substituent is exemplified by an alkyl group having 1 to 10 carbon atoms, a cycloalkyl group having 3 to 10 carbon atoms, an aryl group having 6 to 15 carbon atoms, an aralkyl group having 7 to 15 carbon atoms, a heterocyclic group having 3 to 15 carbon atoms, a halogen atom such as a fluorine atom, a chlorine atom, a bromine atom and an iodine atom, a hydroxyl group, an amino group, a carboxyl group, an alkoxy group, an alkylcarbonyl group, an alkoxycarbonyl group, an arylcarboxy group, an aryloxycarbonyl group, an amide group, an alkylamide group, an arylamide group, and the like.

Examples of the alkyl group having 1 to 30 carbon atoms include a methyl group, an ethyl group, and a propyl group, a butyl group, a pentyl group, a hexyl group, a heptyl group, an octyl group, a nonyl group, a decyl group, a dodecyl group, a tetradecyl group, a hexadecyl group and an icosyl group which may be linear or branched, and the like.

Examples of the alkenyl group having 2 to 30 carbon atoms include an ethenyl group, and a propenyl group, a butenyl group, a pentenyl group, a hexenyl group, a heptenyl group, an octenyl group, a nonenyl group, a decenyl group, a dodecenyl group, a tetradecenyl group, a hexadecenyl group and an icocenyl group which may be linear or branched, and the like.

Examples of the alkynyl group having 2 to 30 carbon atoms include an ethynyl group, a propynyl group, and a butynyl group, a pentynyl group, a hexynyl group, a heptynyl group, an octynyl group, a nonynyl group, a decynyl group, a dodecynyl group, a tetradecynyl group, a hexadecynyl group and an icosynyl group which may be linear or branched, and the like.

Examples of the cycloalkyl group having 3 to 30 carbon atoms include monocyclic groups such as a cyclopropyl group, a cyclobutyl group, a cyclopentyl group, a cyclohexyl group, a cyclopentyl group, a cycloheptyl group, a cyclooctyl group, a cyclodecyl group and a cycloicosyl group; and polycyclic groups such as a dicyclopentyl group, a dicyclohexyl group, a norbornyl group, an adamantyl group, a tricyclodecyl group and a tetracyclododecyl group.

Examples of the cycloalkenyl group having 3 to 30 carbon atoms include monocyclic groups such as a cyclopropenyl group, a cyclobutenyl group, a cyclopentenyl group, a cyclohexenyl group, a cycloheptenyl group, a cyclooctenyl group, a cyclodecenyl group and a cycloicocenyl group; and polycyclic groups such as a dicyclopentenyl group, a dicyclohexenyl group, a norbornenyl group, a tricyclodecynyl group and a tetracyclododecanyl group.

Examples of the cycloalkynyl group having 8 to 30 carbon atoms include monocyclic groups such as a cyclooctynyl group, a cyclodecynyl group and a cycloicosynyl group; and polycyclic groups such as a tetracyclododecynyl group.

Examples of the aryl group having 6 to 30 carbon atoms include a phenyl group, an o-tolyl group, a m-tolyl group, a p-tolyl group, an o-ethylphenyl group, a m-ethylphenyl group, a p-ethylphenyl group, a xylyl group, a cumyl group, a mesityl group, a naphthyl group, an anthryl group, a phenanthryl group, and the like.

Examples of the aralkyl group having 7 to 30 carbon atoms include a benzyl group, a phenethyl group, and the like.

Examples of the heterocyclic group having 3 to 30 carbon atoms include heteroaryl groups such as a furanyl group, a furfuryl group, an isobenzofuranyl group, a pyrrolyl group, an indolyl group, an isoindolyl group, an imidazolyl group, a thiophenyl group, a phosphoryl group, a pyrazolyl group, a pyridinyl group, a quinolinyl group, a pyranyl group, an oxazolyl group, an isoxazolyl group, a thiazolyl group, a benzofuranyl group, a benzothiophenyl group, a benzophosphoryl group, a benzimidazolyl group, a benzoxazolyl group, a benzisooxazolyl group and a benzothiazolyl group; nonheteroaromatic heterocyclic groups such as a tetrahydrofuranyl group, a tetrahydrofurfuryl group, a tetrahydropyranyl group, a pyranylmethyl group, a tetrahydropyranylmethyl group, a tetrahydrothiophenyl group, a pyrrolidinyl group and a piperidinyl group, and the like.

Of these groups (a), the aryl group having 6 to 30 carbon atoms, the aralkyl group having 7 to 30 carbon atoms and the heterocyclic group having 3 to 30 carbon atoms, all of which may be substituted, are preferred in light of the improvement of flexural resistance and etching resistance of the resultant resist underlayer film, and the optionally substituted aryl group having 6 to 30 carbon atoms and the optionally substituted heteroaryl group having 3 to 30 carbon atoms are more preferred, and a phenyl group, a tolyl group, a naphthyl group, a thiophenyl group are even more preferred in light of the ease of synthesis of the compound (A). Moreover, a hydroxy group is preferred as the group (a) in light of increasing the solubility of the compound (A) in the basic solutions, and the ease of synthesis of the compound (A).

The number of the specified group (i) bound to the aromatic ring or heteroaromatic ring of the compound (A) is preferably no less than 0.1 per ring, more preferably no less than 0.5 per ring, even more preferably 0.5 to 5 per ring, and particularly preferably 0.5 to 2 per ring.

The number of the group (a) bound to the aromatic ring or heteroaromatic ring of the compound (A) is preferably 0 to 5 per ring, more preferably 0.1 to 5 per ring, even more preferably 0.5 to 5 per ring, and particularly preferably 0.5 to 2 per ring.

The compound (A) is preferably a compound having the partial structure represented by the following formula (1).

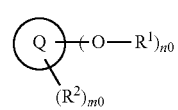

(1)

In the formula (1), Q represents an aromatic ring or heteroaromatic ring; n0 represents an integer of no less than 1; $R^1$ is as defined in the above formula (i); $R^2$ represents a halogen atom, a hydroxy group, or a monovalent organic group having 1 to 30 carbon atoms; and m0 represents an integer of no less than 0, wherein provided that $R^1$ and $R^2$ each present in a plurality of number, the plurality of $R^1$s and $R^2$s may be each the same or different.

Preferably, n0 is an integer of 1 to 5, and more preferably 1 or 2.

Preferably, m0 is an integer of 0 to 5, more preferably an integer of 0 to 3, and even more preferably an integer of 1 to 3.

The aromatic ring and heteroaromatic ring in the partial structure represented by the above formula (i) may form a covalent bond with a partial structure other than the present partial structure, or may be fused to a benzene ring or heteroaromatic ring present in other partial structures.

The compound (A) can be exemplified by, for example, the compound that is obtained by condensing the compound represented by the following formula (2) and the compound represented by the following formula (3) to give a calixarene based compound, and substituting the hydrogen atom of at least a part of the phenolic hydroxyl groups carried by the resultant calixarene based compound with $R^1$. The substitution of the hydrogen atom of the phenolic hydroxyl groups with $R^1$ can be effected by any commonly known method.

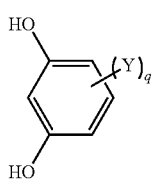

(2)

In the formula (2), Y represents a hydrocarbon group having 1 to 10 carbon atoms; and q represents an integer of 0 to 4.

 (3)

In the formula (3), X represents a p-valent hydrocarbon group having 1 to 8 carbon atoms or a hydrogen atom; and p represents 1 or 2.

The conditions (methods) for the condensation reaction of the compound represented by the above formula (2) with the compound represented by the above formula (3) are not particularly limited, and conventionally well-known methods can be employed. Specifically, a method in which the compound represented by the above formula (2) and the compound represented by the above formula (3) are dehydratively condensed at 60 to 90° C. for 6 to 72 hrs in the presence of a catalyst such as an acid catalyst can be included.

The proportion of the compound represented by the above formula (2) and the compound represented by the above formula (3) employed in the condensation reaction is not particularly limited, but in light of increasing the yield, preferably 1 to 8 mol, more preferably 2 to 6 mol, particularly preferably 3 to 5 mol of the compound represented by the above formula (2) are used relative to 1 mol of the compound represented by the above formula (3). If the proportion is out of the range, the yield of the targeted phenolic compound may be decreased.

The condensation reaction is typically carried out in a reaction solution obtained by dissolving the compound represented by the above formula (2) and the compound represented by the above formula (3) in an appropriate reaction solvent. The reaction solvent is preferably an organic solvent, and more preferably an alcoholic solvent. Specific examples of the alcoholic solvent can include methyl alcohol, ethyl alcohol, n-butanol, isopropyl alcohol and the like. Of these, methyl alcohol and ethyl alcohol are preferred in light of improvement of the yield.

In the step of the condensation reaction (condensation reaction step), a substrate concentration in the reaction solution (the concentration of the total of the compound represented by the above formula (2) and the compound represented by the above formula (3)) is not particularly limited, but in light of improvement of the yield, is preferably no less than 2 mol/L, more preferably no less than 4 mol/L, and particularly preferably 4 to 10 mol/L. If the substrate concentration is less than 2 mol/L, the yield of the targeted phenolic compound may be decreased.

The condensation reaction is typically carried out in the presence of a catalyst. An acid catalyst is preferred as the catalyst. Specific examples of the acid catalyst can include hydrochloric acid, hydrogen chloride, paratoluenesulfonic acid, oxalic acid, sulfuric acid and the like. Of these, hydrochloric acid is preferred in light of improvement of the yield.

After completing the condensation reaction, the phenolic compound can be obtained as a condensate (precipitated substance). It is preferred to purify the obtained condensate (precipitated substance) by washing the same with (1) water, (2) an organic solvent, or (3) a mixed solvent of water and the organic solvent. Specific examples of the organic solvent include ketones such as acetone, methyl ethyl ketone, methyl i-butyl ketone, cyclopentanone, cyclohexanone, 3-methylcyclopentanone and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol and 1,4-hexanedimethylol; ethers such as diethyl ether, tetrahydrofuran and dioxane; esters such as ethyl acetate, n-butyl acetate and i-amyl acetate; aromatic hydrocarbons such as toluene and xylene; phenol, acetonyl acetone, dimethyl formamide, and the like. In particular, methyl alcohol, ethyl alcohol, and diethyl ether are preferred. In addition, it is preferred to purify the condensate (precipitated substance) by washing the same with at least any of organic solvents containing water and ethereal solvent purification. It is to be noted that these organic solvents can be used either alone, or as a mixture of two or more thereof. It is also preferred to remove residual raw materials and by-products from the obtained condensate (precipitated substance) by dissolving the obtained condensate (precipitated substance) in an organic solvent, and washing the dissolving organic solvent with water.

The degree of substitution of the hydrogen atom of the phenolic hydroxyl group with $R^1$ is preferably 10 mol % to 90 mol %, more preferably 20 mol % to 80 mol %, and even more preferably 30 mol % to 70 mol %. The degree of substitution in the above-described range can simultaneously ensure, at a high level, the solubility of the resist underlayer film containing the compound (A) in the basic solution and the etching resistance.

The compound (A) can be specifically exemplified by the compound represented by the following formula (4), the compound represented by the following formula (5), the compound represented by the following formula (6) and the like.

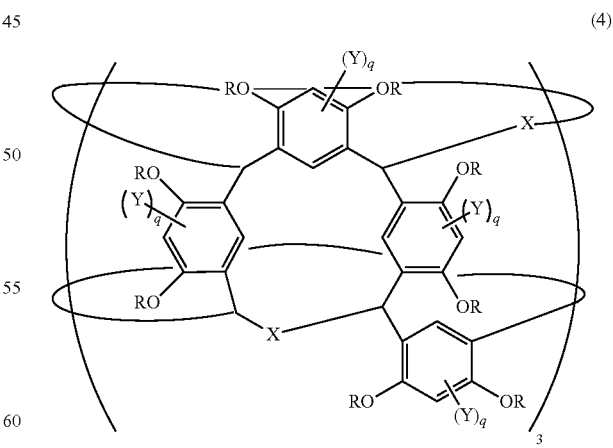

(4)

In the above formula (4), R represents a hydrogen atom or a group that generates an acidic functional group by an action of heat or an acid; X is as defined in connection with X in the formula (3); and Y and q are each as defined in connection with Y and q in the formula (2).

It is to be noted that the group represented by R in the formula (4), which is the group that generates an acidic functional group by an action of heat or an acid, represent the same meaning as the group represented by $R^1$ in the formula (i), which is also the group that generates an acidic functional group by an action of heat or an acid.

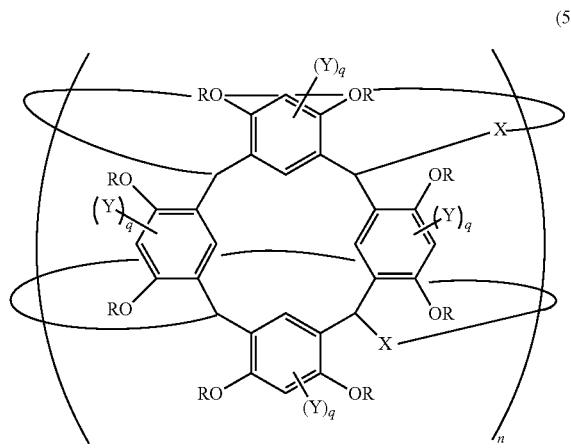

(5)

In the above formula (5), R represents a hydrogen atom or a group that generates an acidic functional group by an action of heat or an acid; X is as defined in connection with X in the formula (3); Y and q are each as defined in connection with Y and q in the formula (2); and n represents 2 or 3.

It is to be noted that the group represented by R in the formula (5), which is the group that generates an acidic functional group by an action of heat or an acid, represent the same meaning as the group represented by $R^1$ in the formula (i), which is also the group that generates an acidic functional group by an action of heat or an acid.

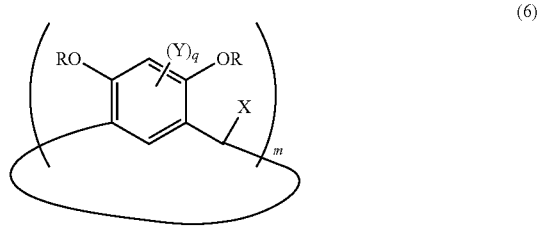

(6)

In the above formula (6), R represents a hydrogen atom or a group that generates an acidic functional group by an action of heat or an acid; X is as defined in connection with X in which p in the above formula (3) is 1; Y and q are each as defined in connection with Y and q in the formula (2); and m represents an integer of 4 to 8.

It is to be noted that the group represented by R in the formula (6), which is the group that generates an acidic functional group by an action of heat or an acid, represent the same meaning as the group represented by $R^1$ in the formula (i), which is also the group that generates an acidic functional group by an action of heat or an acid.

The composition for forming a resist underlayer film may contain one or more compound (A). In addition, the composition for forming a resist underlayer film may contain other calixarene based compounds than the compound (A).

[(B) Solvent]

The composition for forming a resist underlayer film is typically a liquid-like composition which contains a solvent (B) that dissolves the compound (A) as described above.

The solvent (B) is not particularly limited, as long as it can dissolve the compound (A), and, for example, those disclosed in paragraphs [0070] to [0073] of Japanese Unexamined Patent Application, Publication No. 2004-168748, and the like can be employed.

Of these solvents, polyhydric alcohol partial ethers such as propylene glycol monomethyl ether; polyhydric alcohol partial ether acetates such as propylene glycol monomethyl ether acetate, and ethylene glycol monoethyl ether acetate; carboxylate esters such as ethyl lactate, n-butyl acetate, ethyl 3-ethoxypropionate, and methyl 3-methoxypropionate; ketones such as 2-heptanone, and cyclohexanone; and γ-butyrolactone are preferably used, and propylene glycol monomethyl ether acetate is more preferred.

It is to be noted that the solvent may be used either alone, or as a mixture of two or more thereof. The content of the solvent (B) typically falls within a range in which the solid content of the resultant composition is 1 to 80% by mass, preferably 3 to 40% by mass, and more preferably 5 to 30% by mass.

[Other Components]

The composition for forming a resist underlayer film may contain other components such as resins (excluding the compound (A)), surfactants, storage stabilizers, and defoaming agents. The resins include, for example, novolak based resins, resol based resins, acenaphthylene based resins, polyarylene based resins, and the like.

It is preferred, however, that the composition for forming a resist underlayer film is substantially free of any crosslinking agent, since the underlayer film is removed with a basic solution in the step (d). The content of the crosslinking agent is preferably no greater than 3 parts by mass, more preferably no greater than 0.1 parts by mass, and particularly preferably 0 parts by mass relative to 100 parts by mass of the compound (A).

The resist underlayer film formed according to the method for forming a pattern of the embodiment of the present invention is characterized in that it is hardly soluble in organic solvents, and soluble in basic solutions.

The resist underlayer film has been explained in relation to the method for forming a pattern described above, and therefore the detailed explanation thereabout will be omitted here.

It is to be noted that the phrase "hardly soluble in organic solvents" means that when an organic solvent or a resist solution containing an organic solvent or the like is applied on the resist underlayer film after the film formation, the resist underlayer film and the applied solvent or solution are immiscible. Specifically, the phrase "hardly soluble in organic solvents" means that the residual film thickness ratio of the resist underlayer film before and after the contact with propylene glycol methyl ether acetate at 23° C. for 1 min is no less than 99%.

Moreover, the phrase "soluble in basic solutions" means that when a basic solution is applied on the resist underlayer film after the film formation, the resist underlayer film dissolves in the basic solution, and is removed. Specifically, the phrase "soluble in basic solutions" means that the residual film thickness ratio of the resist underlayer film after the contact with 2.38% by mass of a tetramethylammonium hydroxide aqueous solution at 23° C. for 1 min is less than 1%.

Since the resist underlayer film is hardly soluble in organic solvents, the resist underlayer film can inhibit any corrosion by other layers laminated thereon by coating, and functions as a layer. Furthermore, since the resist underlayer film is soluble in basic solutions, the resist underlayer film can be easily removed with any basic solution after the pattern formation, with reducing the influence on the pattern.

EXAMPLES

Hereinafter, embodiments of the present invention are more specifically described by way of Examples. However, these Examples should not be construed as in any way limiting the present invention. Herein, the "part" is on mass basis unless otherwise stated particularly. Each of measurement and evaluation in Examples and Comparative Examples was conducted according to the following procedure.

Synthesis Example 1

Synthesis of Compound (A-1)

Resorcinol (2.20 g, 20 mmol) was dissolved in ethanol (4.5 mL), and hydrochloric acid (1.5 mL) was added to the mixture. The solution was ice-cooled to 5° C. with stirring, and a 50% aqueous solution of glutaraldehyde (0.40 g, 2 mmol) was slowly added dropwise. Thereafter, the mixture was heated at 80° C. for 48 hrs to obtain a yellow suspension. The suspension was poured into methanol, and the precipitated substance was collected by filtration, and washed with methanol three times. The obtained solid was dried under reduced pressure at room temperature for 24 hrs. As a result, a powdery pale yellow solid (S) was obtained (recovery: 0.43 g (yield: 79%)). The confirmation of the structure of the obtained pale yellow solid (S) was carried out using MALDI-TOF-MS (model: SHIMAZU/KRATOS matrix-assisted laser ionization time-of-flight mass spectrometry apparatus KOMPACT MALDI IV tDE, from Shimadzu Corporation), IR (model: FT-IR 420, manufactured by JASCO Corporation) and $^1$H-NMR (model: JNM-ECA-500, manufactured by JEOL, Ltd.). The results are shown below.

MALDI-TOF-MS: It was indicated that only a compound with a molecular weight of 1705.86 was obtained.

IR (film method): (cm$^{-1}$)

3406 ($\nu_{OH}$); 2931 ($\nu_{C-H}$); 1621, 1505, 1436 ($\nu_{C=C\,aromatic}$)

$^1$H-NMR (500 MHz, solvent: CDCl$_3$, internal standard: TMS): δ (ppm)=0.86 to 2.35 (b, 12.0H), 3.98 to 4.22 (m, 4.0H), 6.09 to 7.42 (m, 8.0H), 8.65 to 9.56 (m, 8.0H)

The pale yellow solid (S) (3.5 g) obtained thus were added to 1-methyl-2-pyrrolidone (40 g), followed by the addition of tetrabutylammonium bromide (0.8 g), and then the mixture was stirred at 70° C. for 4 hrs to dissolve the ingredients. After the dissolution, potassium carbonate (3.3 g) was added, and the mixture was stirred at 70° C. for 1 hour. Thereafter, 2-methyl-2-adamantyl bromoacetate (6.9 g) dissolved in advance in 1-methyl-2-pyrrolidone (20 g) was gradually added, and the mixture was stirred at 70° C. for 6 hrs. After stirring, the mixture was cooled to room temperature, and extracted with water/methylene chloride. Subsequently, the organic layer was washed with 3% aqueous oxalic acid (100 mL×3), and then with water (100 mL×2). The aqueous layer was discarded, and then the organic layer was dried over magnesium sulfate. Thereafter, purification was performed on silica gel column using a mixture of hexane and ethyl acetate (hexane:ethyl acetate=1:4) as an elution liquid, to obtain 3.2 g of the compound (A-1) shown below as the compound represented by the following formula (A). $^1$H-NMR analysis showed that the protection rate of the compound (A-1) (rate of substitution of the hydrogen atom of the phenolic hydroxyl group in the compound (A-1) with the 2-methyl-2-adamantyloxycarbonylmethyl group) was 40%.

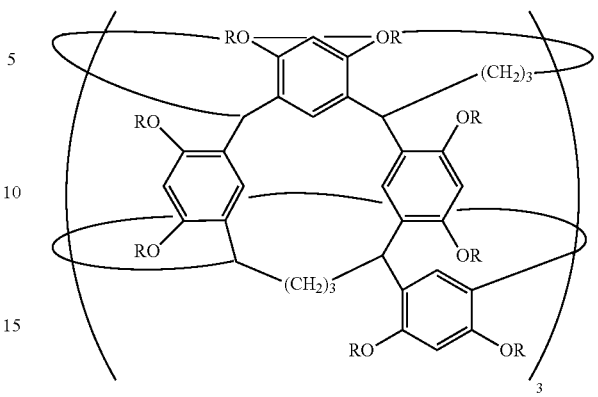

(A)

$^1$H-NMR (500 MHz, solvent: CDCl$_3$, internal standard: TMS): δ (ppm)=0.82 to 2.40 (m, 66.4H), 3.80 to 4.52 (m, 10.4H), 6.08 to 7.41 (m, 8.0H), 8.62 to 9.54 (m, 3.2H)

Synthesis Example 2

Synthesis of Compound (A-2)

The method identical to that of Synthesis Example 1 was employed, except that 2-methyl-2-adamantyl bromoacetate (6.9 g) was changed to tert-butyl bromoacetate (4.7 g), and the compound represented by the above formula (A) (A-2) (3.5 g) was obtained. $^1$H-NMR analysis showed that the protection rate of the compound (A-2) (rate of substitution of the hydrogen atom of the phenolic hydroxyl group in the compound (A-2) with the tert-butoxycarbonylmethyl group) was 50%.

Synthesis Example 3

Synthesis of Resin (1)

Into a separable flask equipped with a thermometer, were charged 10 parts of 2,7-naphthalenediol/formaldehyde condensate (a hydroxy group-bearing resin), 20 parts of paratoluenesulfonic acid, and methylisobutyl ketone, and allowed to react at 50° C. for 6 hrs with stirring. After completing the reaction, the reaction solution was cooled at or below 30° C. by water cooling. The reaction solution was sequentially washed with 1% by mass of oxalic acid and pure water, the obtained organic layer was concentrated, and then the obtained concentrate was dried at 50° C. for 17 hrs, to obtain a resin (1).

Synthesis Example 4

Synthesis of Resin (2)

Into a separable flask equipped with a thermometer, were charged 10 parts of 2,7-naphthalenediol/formaldehyde condensate (a hydroxy group-bearing resin), 10 parts of propargyl bromide, 10 parts of triethylamine, and 40 parts of tetrahydrofuran, and allowed to react at 50° C. for 12 hrs with stirring. After completing the reaction, the reaction solution was cooled at or below 30° C. by water cooling. After cooling, the reaction solution was charged into a large amount of n-heptane. Thereafter, the deposited solid was separated by a decantation method, and washed with a large amount of n-heptane. Subsequently, the solid was dissolved in methylisobutyl ketone, and sequentially washed with 1% by mass of oxalic acid and pure water, to remove residual triethylamine. Thereafter, the obtained organic layer was concentrated, and the obtained concentrate was dried at 50° C. for 17 hrs, to obtain a resin (2). The introduction rate of the propargyl group in the resin (2) was 90%.

Preparation Example 1

Preparation of Resist Underlayer Film Formation Composition (U-1)

A solution was obtained by dissolving 10 parts of the compound (A-1) obtained in Synthesis Example 1 in 90 parts of propylene glycol monomethyl ether acetate (solvent (B)). Thereafter, the solution was filtered through a membrane filter with a pore size of 0.2 μm to prepare a composition for forming a resist underlayer film (U-1).

Preparation Example 2

Preparation of Resist Underlayer Film Forming Composition (U-2)

A solution was obtained by dissolving 10 parts of the compound (A-2) obtained in Synthesis Example 2 in 90 parts of propylene glycol monomethyl ether acetate (solvent (B)). Thereafter, the solution was filtered through a membrane filter with a pore size of 0.2 μm to prepare a composition for forming a resist underlayer film (U-2).

Preparation Example 3

Preparation of Resist Underlayer Film Forming Composition (U-3)

A solution was obtained by dissolving 2 parts of the compound (A-2) obtained in Synthesis Example 2, 4 parts of the resin (1) obtained in Synthesis Example 3, and 4 parts of the resin (2) obtained in Synthesis Example 4 in 90 parts of propylene glycol monomethyl ether acetate (solvent (B)). Thereafter, the solution was filtered through a membrane filter with a pore size of 0.2 μm to prepare a composition for forming a resist underlayer film (U-3).

Preparation Example 4

Preparation of Resist Underlayer Film Forming Composition (U-4)

A solution was obtained by dissolving 2.1 parts of the compound (A-2) obtained Synthesis Example 2, 3.8 parts of the resin (1) obtained in Synthesis Example 3, and 4.1 parts of the resin (2) obtained in Synthesis Example 4 in 90 parts of propylene glycol monomethyl ether acetate (solvent (B)). Thereafter, the solution was filtered through a membrane filter with a pore size of 0.2 μm to prepare a composition for forming a resist underlayer film (U-4).

Formation of Resist Underlayer Film

Examples 1 to 13

Each composition for forming a resist underlayer film shown in Table 1 below, which was prepared as described above, was applied on a silicon wafer (a substrate to be processed) by a spin coating method. Thereafter, the applied composition was sintered (baked) under an ambient air atmosphere, under a hard baking (HB) condition of temperature (° C.) and time(s) shown in Table 1 below, to form a resist underlayer film with a film thickness of 200 nm, whereby a "substrate with a resist underlayer film" having the resist underlayer film formed on the substrate to be processed was obtained.

Evaluation

For the substrates with the resist underlayer film as formed above, resistance test of the resist underlayer film to organic solvents, solubility test for the resist underlayer film in the alkaline developer (2.38% TMAH), and etching resistance were evaluated according to the methods described below.

[Resistance of Resist Underlayer Film to Organic Solvents]

The obtained substrate with the resist underlayer film was immersed in propylene glycol monomethyl ether acetate (23° C.) for 1 min. The film thickness before and after the immersion was measured by a spectroscopic ellipsometer "UV1280E" (manufactured by KLA-Tencor Corporation), and the residual film thickness ratio was calculated from the measurements and then evaluated. The evaluation criteria were as follows: the residual film thickness ratio: "A", no less than 99%; and "B", less than 99%.

[Solubility Test for Resist Underlayer Film in Alkaline Developer (2.38% TMAH)]

The obtained substrate with the resist underlayer film was immersed in an alkaline developer (2.38% TMAH) for 1 min. The film thickness before and after the immersion was measured by a spectroscopic ellipsometer "UV1280E" (manufactured by KLA-Tencor Corporation), and the residual film thickness ratio was calculated from the measurements and then evaluated. The evaluation criteria were as follows: the residual film thickness ratio: "A", less than 1%; and "B", no less than 1%.

[Etching Resistance of Resist Underlayer Film]

The resist underlayer film (film thickness of 200 nm) of the obtained substrate with the resist underlayer film was etched using an etching apparatus (manufactured by LAM research, trade name "LAM etcher") under the condition of $C_4F_8/Ar/O_2/N_2=6.5/240/6.5/25$ sccm (RF power: 220 W (Top), 1,500 W (Bottom); treatment time: 30 sec; temperature: 15° C.), the film thickness of the resist underlayer film before and after the etching treatment was measured, and the etching rate was calculated to evaluate the etching resistance. It is to be noted that the evaluation of the etching resistance was carried out by using, as a reference resist underlayer film, the resist underlayer film formed from a composition for forming a resist underlayer film (trade name "NFC HM8053") manufactured by JSR Corporation. The evaluation criteria were as follows: the etching rate of the resist underlayer film relative to the reference resist underlayer film: "A", less than 95%; and "B", no less than 95%.

Evaluation results of the resist underlayer film formed in Examples for the resistance test to organic solvent, the solubility test for the alkaline developer (2.38% TMAH) and the etching resistance were assembled in Table 1.

TABLE 1

| | Resist Underlayer Film Forming Composition | | HB Condition | | Resistance Test | Solubility Test in | |
|---|---|---|---|---|---|---|---|
| | Type | Blend Amount (parts) | Temperature (°C.) | Time (s) | to Organic Solvent | Alkaline Developer (2.38% TMAH) | Etching Resistance |
| Example 1 | U-1 | 100 | 250 | 120 | A | A | B |
| Example 2 | U-1 | 100 | 260 | 120 | A | A | B |
| Example 3 | U-1 | 100 | 270 | 120 | A | A | B |
| Example 4 | U-1 | 100 | 280 | 120 | A | A | B |
| Example 5 | U-1 | 100 | 290 | 120 | A | A | B |
| Example 6 | U-2 | 100 | 200 | 120 | B | A | B |
| Example 7 | U-2 | 100 | 210 | 120 | B | A | B |
| Example 8 | U-2 | 100 | 220 | 120 | A | A | B |
| Example 9 | U-2 | 100 | 230 | 120 | A | A | B |
| Example 10 | U-3 | 100 | 220 | 60 | A | A | A |
| Example 11 | U-3 | 100 | 220 | 60 | A | A | A |
| Example 12 | U-4 | 100 | 220 | 60 | A | A | A |
| Example 13 | U-4 | 100 | 220 | 60 | A | A | A |

It was confirmed from the results shown in Table 1 that the resist underlayer film formed from the composition for forming a resist underlayer film containing the specified calixarene compound (A) and the solvent (B) exhibited favorable organic solvent resistance and peelability with an alkaline developer (2.38% TMAH), and had superior etching resistance. Moreover, it was found that the application of the compositions for forming resist underlayer films (U-3) and (U-4) that contain other resins in addition to the compound (A) allowed for the reduction of the baking time without any deterioration of the performance of the resist underlayer film.

The method for forming a pattern according to the embodiment of the present invention enables easy removal of a resist underlayer film after the etching step, with reducing the influence on a substrate underlying the resist underlayer film. Therefore, the method for forming a pattern according to the embodiment of the present invention can be suitably used for low dielectric materials used in semiconductor substrates, and can produce pattern-formed substrates of high-quality.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a pattern comprising the steps in the following order of:
    providing a composition to form a resist underlayer film on an upper face side of a substrate to be processed, the composition containing a calixarene based compound having a group represented by a following formula (i) bound to at least a part of an aromatic ring or at least a part of a heteroaromatic ring of the calixarene based compound, $$\text{—O—R}^1 \qquad (i)$$

wherein $R^1$ represents a group that generates an acidic functional group by an action of heat or an acid;
    forming a resist pattern on an upper face side of the resist underlayer film;
    etching the resist underlayer film and the substrate using the resist pattern as a mask to form the pattern on the substrate; and
    removing the etched resist underlayer film from the substrate with a basic solution,
    the method further comprising heating an entirety of the resist underlayer film when $R^1$ represents a group that generates an acidic functional group by an action of heat, or generating an acid in an entirety of the resist underlayer film when $R^1$ represents a group that generates an acidic functional group by an action of an acid, so that the acidic functional group is generated prior to removing the etched resist underlayer film.

2. The method according to claim 1, further comprising:
    forming an intermediate layer on the upper face side of the resist underlayer film before forming the resist pattern and after providing the composition to form the resist underlayer film,
    wherein the intermediate layer is etched when the resist underlayer film and the substrate are etched.

3. The method according to claim 1,
    wherein $R^1$ represents a group that generates the acidic functional group by an action of heat, and the entirety of the resist underlayer film is heated to generate the acidic functional group prior to removing the etched resist underlayer film.

* * * * *